(12) United States Patent
Mun et al.

(10) Patent No.: US 11,094,753 B2
(45) Date of Patent: Aug. 17, 2021

(54) ORGANIC LIGHT EMITTING DIODE DISPLAY DEVICE AND METHOD OF FABRICATING THE SAME

(71) Applicant: LG Display Co., Ltd., Seoul (KR)

(72) Inventors: Byung-June Mun, Paju-si (KR); Seung-Hyun Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/704,321

(22) Filed: Dec. 5, 2019

(65) Prior Publication Data
US 2020/0194514 A1 Jun. 18, 2020

(30) Foreign Application Priority Data
Dec. 17, 2018 (KR) .......................... 10-2018-0163437

(51) Int. Cl.
H01L 51/52 (2006.01)
H01L 27/32 (2006.01)
H01L 51/00 (2006.01)
H01L 51/56 (2006.01)

(52) U.S. Cl.
CPC ...... *H01L 27/3223* (2013.01); *H01L 27/3244* (2013.01); *H01L 51/0031* (2013.01); *H01L 51/56* (2013.01)

(58) Field of Classification Search
None
See application file for complete search history.

(56) References Cited

U.S. PATENT DOCUMENTS

| 2007/0138956 A1 | 6/2007 | Lee | |
| 2015/0060819 A1* | 3/2015 | Sato | H01L 27/3276 257/40 |
| 2018/0061910 A1* | 3/2018 | Cai | H01L 27/3223 |
| 2018/0151850 A1 | 5/2018 | Lee | |
| 2018/0301519 A1* | 10/2018 | Ma | H01L 27/3246 |
| 2019/0123114 A1* | 4/2019 | Park | H01L 27/3276 |

FOREIGN PATENT DOCUMENTS

| JP | 2004-184702 A | 7/2004 |
| JP | 2007-173205 A | 7/2007 |
| JP | 2018-181620 A | 11/2018 |

OTHER PUBLICATIONS

Extended European Search Report dated Apr. 23, 2020, issued in corresponding European Patent Application No. 19214456.6.
Office Action dated Sep. 15, 2020, issued in corresponding Japanese Patent Application No. 2019-197014. Note: US 20180151850 cited therein is already of record.

* cited by examiner

*Primary Examiner* — Ali Naraghi
(74) *Attorney, Agent, or Firm* — Morgan, Lewis & Bockius LLP

(57) ABSTRACT

An organic light emitting diode display device includes a substrate; a plurality of driving elements and a plurality of light emitting diodes on the substrate; and at least one dummy pattern on the substrate and including a first electrode, a dummy layer, and a second electrode, wherein the first electrode and the dummy layer are electrically separated from each other.

10 Claims, 7 Drawing Sheets

ORGANIC LIGHT EMITTING DIODE DISPLAY DEVICE AND METHOD OF FABRICATING THE SAME

CROSS REFERENCE TO RELATED APPLICATIONS

The present application claims the priority benefit of Korean Patent Application No. 10-2018-0163437 filed in Republic of Korea on Dec. 17, 2018, which is hereby incorporated by reference in its entirety for all purposes as if fully set forth herein.

BACKGROUND

Technical Field

The present disclosure relates to an organic light emitting diode display device, and more particularly, to an organic light emitting diode display device where a fabrication stability in a disposition of a light emitting layer and a method of fabricating the organic light emitting diode display device.

Discussion of the Related Art

An organic light emitting diode (OLED) display device is an emissive type display device. Because the OLED display device does not include a separate light source, the OLED display device has a light weight and a thin profile differently from a liquid crystal display (LCD) device. In addition, the OLED display device has an advantage in power consumption due to a low voltage driving, superior color reproducibility, response speed, and contrast ratio. As a result, the OLED display device has been researched as a next generation display device.

Because the OLED display device includes a plurality of pixels and emits light due to an electron and a hole injected into a light emitting layer in each pixel, a uniform supply of a current applied to the OLED device is required. Each pixel of the OLED display device includes a data line and a gate line crossing each other, a driving element connected to the data line and the gate line, and a light emitting element. An oxide thin film transistor (TFT) having a semiconductor layer of an oxide semiconductor, which has a electron mobility faster than an amorphous TFT having a semiconductor layer of amorphous silicon and has a fabrication process simpler than and a fabrication cost lower than a poly silicon TFT having a semiconductor layer of polycrystalline silicon, has been widely researched as the driving element.

The light emitting layer may be disposed through a vacuum evaporation method, a laser transfer method, a thermal transfer method, a screen printing method, and an inkjet printing method. The inkjet printing method has been widely researched. For example, the inkjet printing method where an organic material solution equal to or smaller than several tens pico-liters ($10^{-12}$ liter) is sprayed to dispose the light emitting layer similar to an ink sprayed on a paper has a greater material efficiency as compared to the vacuum evaporation method where a gaseous compound reacts in a vacuum state. However, during the disposition process, there exists difficulties in accurate control of a disposition place and a fine adjustment of an disposition amount.

SUMMARY

Accordingly, embodiments of the present disclosure are directed to an organic light emitting diode display device and a method of fabricating the organic light emitting diode display device that substantially obviate one or more of the problems due to limitations and disadvantages of the related art.

An aspect of the present disclosure is to provide an organic light emitting diode display device where an error in a deposition position during a deposition process of a light emitting layer is minimized or reduced, and a method of fabricating the organic light emitting diode display device.

Another aspect of the present disclosure is to provide an organic light emitting diode display device where an error in a deposition range of a light emitting layer during a deposition process of the light emitting layer is minimized or reduced, and a method of fabricating the organic light emitting diode display device.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present disclosure, as embodied and broadly described herein, an organic light emitting diode display device comprises a substrate; a plurality of driving elements and a plurality of light emitting diodes on the substrate; and at least one dummy pattern on the substrate and including a first electrode, a dummy layer, and a second electrode, wherein the first electrode and the dummy layer are electrically separated from each other.

In another aspect, a method of fabricating an organic light emitting diode display device comprises disposing a driving element, a light emitting diode and at least one dummy pattern on a substrate, the at least one dummy pattern including a first electrode, a dummy layer, and a second electrode on the first electrode and the dummy layer; and detecting a disposition state of the light emitting diode, wherein detecting the disposition state of the light emitting diode includes detecting an error according to an emission of light from the at least one dummy layer by applying a current to the first electrode and the second electrode of the at least one dummy pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain various principle. In the drawings.

DETAILED DESCRIPTION

Figure 1:
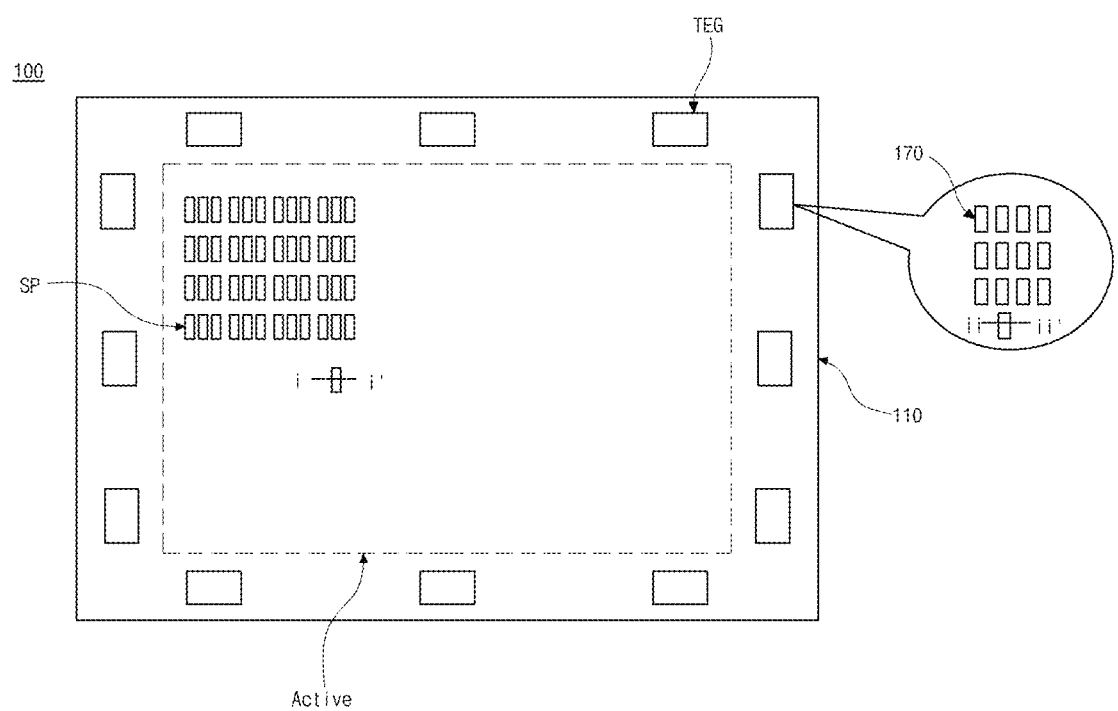
FIG. 1 is a plan view showing an organic light emitting diode display device according to a first embodiment of the present disclosure.

Reference will now be made in detail to embodiments of the present disclosure, examples of which may be illustrated in the accompanying drawings. In the following description, a detailed description of functions or configurations related to this document that are well-known to those skilled in the art may be omitted. The progression of processing steps and/or operations described is an example. The sequence of steps and/or operations is not limited to that set forth herein and may be changed as is known in the art or apparent to those skilled in the art, with the exception of steps and/or operations necessarily occurring in a particular order. Names of the respective elements used in the following explanations are selected only for convenience of writing the specification and may thus be different from those used in actual products.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the present disclosure is only defined by scopes of claims.

A shape, a size, a ratio, an angle, and a number disclosed in the drawings for describing embodiments of the present disclosure are merely an example. Thus, the present disclosure is not limited to the illustrated details. Unless otherwise described, like reference numerals refer to like elements throughout. In the following description, when the detailed description of the relevant known function or configuration is determined to unnecessarily obscure an important point of the present disclosure, the detailed description of such known function or configuration may be omitted. In a case where terms "comprise," "have," and "include" described in the present specification are used, another part may be added unless a more limiting term, such as "only," is used. The terms of a singular form may include plural forms unless referred to the contrary.

In construing an element, the element is construed as including an error or tolerance range even where no explicit description of such an error or tolerance range. In describing a position relationship, when a position relation between two parts is described as, for example, "on," "over," "under," or "next," one or more other parts may be disposed between the two parts unless a more limiting term, such as "just" or "direct(ly)," is used. In describing a time relationship, when the temporal order is described as, for example, "after," "subsequent," "next," or "before," a case which is not continuous may be included unless a more limiting term, such as "just," "immediate(ly)," or "direct(ly)," is used.

It will be understood that, although the terms like "first," "second," etc., may be used herein to describe various elements, these elements should not be limited by these terms as they are not used to define a particular order. These terms are used only to distinguish one element from another. For example, a first element could be termed a second element, and, similarly, a second element could be termed a first element, without departing from the scope of the present disclosure.

In describing elements of the present disclosure, the terms like "first," "second," "A," "B," "(a)," and "(b)" may be used. These terms are merely for differentiating one element from another element, and the essence, sequence, order, or number of a corresponding element should not be limited by the terms. Also, when an element or layer is described as being "connected," "coupled," or "adhered" to another element or layer, the element or layer can not only be directly connected or adhered to that other element or layer, but also be indirectly connected or adhered to the other element or layer with one or more intervening elements or layers "disposed" between the elements or layers, unless otherwise specified.

The term "at least one" should be understood as including any and all combinations of one or more of the associated listed items. For example, the meaning of "at least one of a first item, a second item, and a third item" encompasses the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto, unless otherwise specified.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in a co-dependent relationship.

Reference will now be made in detail to the present disclosure, examples of which are illustrated in the accompanying drawings.

An organic light emitting diode (OLED) display device includes a plurality of pixels each having a light emitting diode, and an image is displayed by light from the light emitting diode. The light emitting diode includes two electrodes and a light emitting layer. The light emitting layer includes an emitting material layer. The light emitting layer may further include a hole injecting layer, a hole transporting layer, an electron transporting layer and an electron injecting layer. One of the two electrodes may be a pixel electrode connected to a driving element and the other of the two electrodes may be a common electrode of a cathode.

The light emitting diode may be disposed at a front portion or a predetermined portion of the OLED display device according to a fabrication method of the light emitting diode. A step of disposing the light emitting diode, specifically the light emitting layer may be performed through an inkjet printing method or an evaporation method using a mask.

Deterioration, such as a blurring and a stain, may occur due to a disposition error of the light emitting layer in the pixel. There exists difficulties in judgment and control for the deterioration with a naked eye. The OLED display device where a range and a cause of the deterioration in a fabrication process of the light emitting layer are easily measured and the deterioration in the process is minimized or reduced by reflecting a result of the measurement immediately and a method of fabricating the OLED display device is suggested.

FIG. 1 is a plan view showing an organic light emitting diode display device according to a first embodiment of the present disclosure.

In FIG. 1, an organic light emitting diode (OLED) display device 100 includes a substrate 110 having a plurality of pixels SP. The substrate 110 includes at least one test element group TEG (TEG: Test Element Group, Test pattern Element Group) having a dummy pattern 170. The substrate 110 may be a glass substrate or a flexible substrate of a polyimide group. In addition, the substrate may have a multiple structure including a barrier layer for minimizing or reducing infiltration of moisture and oxygen.

Although not shown, the at least one test element group TEG may include an additional driving element connected to the dummy pattern 170 and a circuit unit for applying a current.

The pixel SP is disposed in an display region on the substrate 110, and the at least one test element group TEG may be disposed in a non-display region surrounding the display region. In another embodiment, the at least one test element group TEG may be disposed in the display region. The at least one test element group TEG includes at least one dummy pattern 170 for verifying whether elements of the pixel SP are normally disposed on the substrate 110. The at least one test element group TEG may be disposed in a region which is separated by a scribing.

Figure 2:
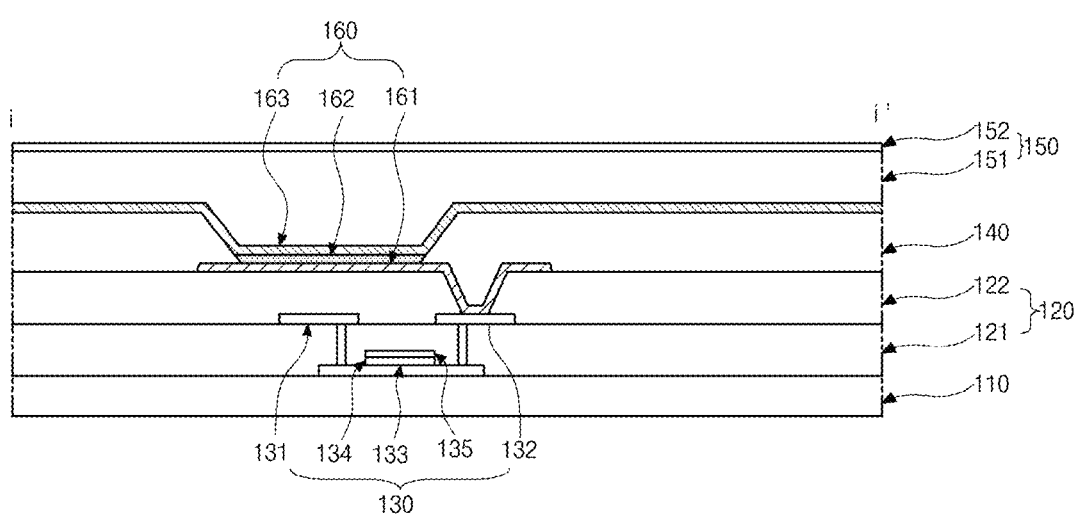
FIG. 2 is a cross-sectional view taken along line i-i' of FIG. 1.

FIG. 2 is a cross-sectional view taken along line i-i' of FIG. 1.

In FIG. 2, the substrate 110 includes the plurality of pixels SP, and a driving element 130 and a light emitting diode 160 are disposed in each pixel SP on the substrate 110. The substrate 110 may include one of a glass, a plastic and a metal. The substrate 110 may be a flexible substrate which is bendable, foldable or rollable. When the substrate 110 includes a plastic, the plastic may include one of polyethersulphone (PES), polyacrylate (PAR), polyetherimide (PEI), polyethyelenen napthalate (PEN), polyethyelene tereptha-late (PET), polyphenylene sulfide (PPS), polyallylate, polyimide (PI), polycarbonate (PC), tri acetyl cellulose (TAC) and cellulose acetate propionate (CAP).

The light emitting diode 160 includes a pixel electrode 161, a light emitting layer 162 and a common electrode 163. The pixel electrode 161 may be an anode and may have a single layer or a multiple layer including at least one of indium (In), silver (Ag), zinc (Zn), tin (Sn), aluminum zinc oxide (AZO), gallium zinc oxide (GZO), zinc oxide (ZnO), indium tin oxide (ITO), indium zinc oxide (IZO) and indium tin zinc oxide (ITZO). When the pixel electrode 161 has a multiple layer, the pixel electrode 161 may include at least one transparent conductive oxide layer and at least one metal layer.

The transparent conductive oxide layer has a relatively high work function to supply a hole to the light emitting layer 162. As a result, the transparent conductive oxide layer may contact the light emitting layer 162.

The light emitting layer 162 includes a thin film of an organic material and generates light by recombination of a hole and an electron injected through the pixel electrode 161 and the common electrode 163. Although not shown, the light emitting layer 162 may include a hole injecting layer (HIL), a hole transporting layer (HTL), an emitting material layer (EML), an electron transporting layer (ETL) and an electron injecting layer (EIL) and may have a multiple layer including a HIL, a HTL, an EML, an ETL and an EIL.

The pixel electrode 161 may function as an anode, and the common electrode 163 may function as a cathode. However, the pixel electrode 161 and the common electrode 163 may be not limited thereto.

The HIL is a buffer layer for increasing an injection efficiency of a hole by lowering an energy barrier between the pixel electrode 161 and the EML. The HTL increases a recombination efficiency of a hole and an electron in the EML by restricting an electron, which is injected from the common electrode 163 and transferred to the EML, inside the EML. Similarly, the EIL is a buffer layer for increasing an injection efficiency of an electron by lowering an energy barrier between the common electrode 163 and the EML. The ETL increases the recombination efficiency of a hole and an electron in the EML by restricting a hole, which is injected from the pixel electrode 161 and transferred to the EML, inside the EML. The EIL and the ETL may be formed as a single layer. The EML may include a thin film of an organic material of a low molecule or a high molecule (a polymer molecule). The EML may generates an exiton by recombining a hole and an electron injected from the pixel electrode 161 and the common electrode 163 and transferred to the EML, thereby generating light corresponding to an energy emitted from the exiton transitioning from an exited state to a ground state. A color (a wavelength) of the light may be determined according to a band-gap energy of the organic material of the EML.

The pixel electrode 161 and the common electrode 163 may be an anode or a cathode and may be a transparent electrode where the light emitted from the light emitting layer 162 passes. One of the pixel electrode 161 and the common electrode 163 may be a reflective electrode inducing an emission along one direction.

The driving element 130 may include an oxide thin film transistor (TFT) using an oxide semiconductor or a poly silicon TFT using a polycrystalline silicon. However, the driving element 130 is not limited thereto. For example, the driving element 130 may include a gate electrode 135, an insulating layer 134 on the gate electrode 135 and an active layer 133 on the gate insulating layer 134.

The active layer 133 is electrically connected a source electrode 131 and a drain electrode 132, and the drain electrode 132 is electrically connected to the pixel electrode 161 of the light emitting diode 160. A passivation layer (not shown) and a planarizing layer 120 are disposed on the driving element 130 for protecting the driving element 130 during subsequent processes.

The planarizing layer 120 may have a multiple structure including first and second planarizing layers 121 and 122.

The planarizing layer 120 may have a contact hole for electrical connection between the driving element 130 and the light emitting diode 160. An emission region of the pixel SP may be defined as an area where the light emitting diode 160 on the planarizing layer 120 emits light and may correspond to an opening of a bank layer 140.

An encapsulating layer 150 is disposed on the light emitting diode 160 to cover the light emitting diode 160. The encapsulating layer 150 is disposed to protect the light emitting diode 160 from oxygen and moisture. The encapsulating layer 150 includes a first encapsulating layer 151 of an organic material and a second encapsulating layer 152 of an inorganic material.

The encapsulating layer 150 may have a single layer of a hybrid layer including an organic material and an inorganic material or a multiple layer where an organic layer and an inorganic layer are alternately disposed. Alternatively, the encapsulating layer 150 may include a capping layer, a sealing layer and an encapsulation substrate.

Figure 3:
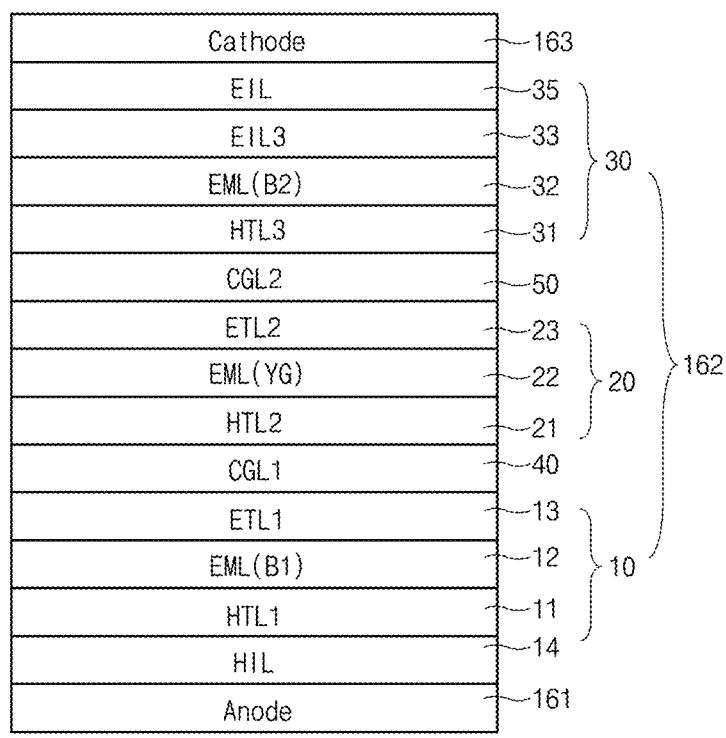
FIG. 3 is a cross-sectional view showing a light emitting layer of an organic light emitting diode display device according to a first embodiment of the present disclosure.

FIG. 3 is a cross-sectional view showing a light emitting layer of an organic light emitting diode display device according to a first embodiment of the present disclosure.

In FIG. 3, the light emitting diode emits a white colored light. The light emitting diode may emit a red (R) colored light, a green (G) colored light or a blue (B) colored light in another embodiment. Further, the light emitting diode may emit ultraviolet (UV) light in another embodiment.

The light emitting diode includes the pixel electrode 161, the light emitting layer 162 and the common electrode 163. The light emitting layer 162 includes a first emitting unit 10, a first charge generating layer (CGL1) 40, a second emitting unit 20, a second charge generating layer (CGL2) 50 and a third emitting unit 30. The pixel electrode may be defined as an anode, and the common electrode 163 may be defined as a cathode.

The first emitting unit 10 is disposed on the pixel electrode 161 to emit a blue (B1) colored light. The first emitting unit 10 includes a hole injecting layer (HIL) 14, a first hole transporting layer (HTL1) 11, a first blue emitting material layer (EML1) 12 and a first electron transporting layer (ETL1) 13.

The pixel electrode 161 may include a transparent conductive oxide (TCO) having a relatively high work function, and the common electrode 163 may include a metallic material having a relatively low work function. For example, the transparent conductive oxide may include one of indium tin oxide (ITO), indium zinc oxide (IZO), indium gallium zinc oxide (IGZO), aluminum zinc oxide (AZO), tin oxide ($TO:SnO_2$) and zinc oxide (ZnO). However, the transparent conductive oxide is not limited thereto.

The HIL 14 is disposed on the pixel electrode 161. For example, the HIL 14 may include one of 4,4',4''-tris(3-methylphenylphenylamino)triphenylamine (MTDATA), copper phthalocyanine (CuPc) and poly(3,4-ethylenedioxythiphene) polystyrene sulfonate (PEDOT/PSS). However, the HIL 14 is not limited therero.

The HTL1 11 is disposed on the HIL 14. For example, the HTL1 11 may include one of N,N'-diphenyl-N,N'-bis(3-methylphenyl)-1,1'-bi-phenyl-4,4'-diamine (TPD), N,N-di-naphthyl-N,N'-diphenyl benzidine (NPD) and N,N'-di(naphthalen-1-yl)-N,N'-diphenyl-benzidine (NPB). However, the HTL1 11 is not limited thereto. The HTL1 11 may have the same material as the HIL 14 except that the HTL1 11 does not include a positive (P) type dopant, and the HIL 14 and the HTL1 11 may be formed through subsequent deposition processes using the same process apparatus.

A first blue emitting material layer (EML(B1)) 12 is disposed on the HTL1 11. For example, the EML(B1) 12 may include an organic material emitting a blue (B1) colored light having a peak wavelength range of about 440 nm to about 480 nm.

The ETL1 13 is disposed on the EML(B1) 12. The ETL1 13 may include a material having a relatively high electron mobility for sufficiently supplying an electron to the EML (B1) 12. The ETL1 13 may include one of pyridine group and pyrimidine group. For example, the ETL1 13 may include one of carbazole, oxadiazole, triazole, phenanthroline, benzoxazole, benzothiazole and benzothiazole where pyridine group or pyrimidine group is chemically combined. However, the ETL1 13 is not limited thereto.

The CGL1 40 is disposed between the first emitting unit 10 and a second emitting unit 20 to control a charge balance between the first emitting unit 10 and the second emitting unit 20. The second and third emitting unit 20 and 30 may have a lamination structure similar to the first emitting unit 10. The second emitting unit 20 may include an organic material emitting a yellow-green (YG) colored light and the third emitting unit 30 may include an organic material emitting a blue (B2) colored light.

Illustration on parts of the second and third emitting units 20 and 30 similar to the first emitting unit 10 will be omitted hereinafter. The light emitting diode emitting a white colored light may have a structure where various layers are sequentially disposed. While the various layers are disposed, there may exist a problem in a fine adjustment of a disposition place and a disposition amount.

Figure 4A:
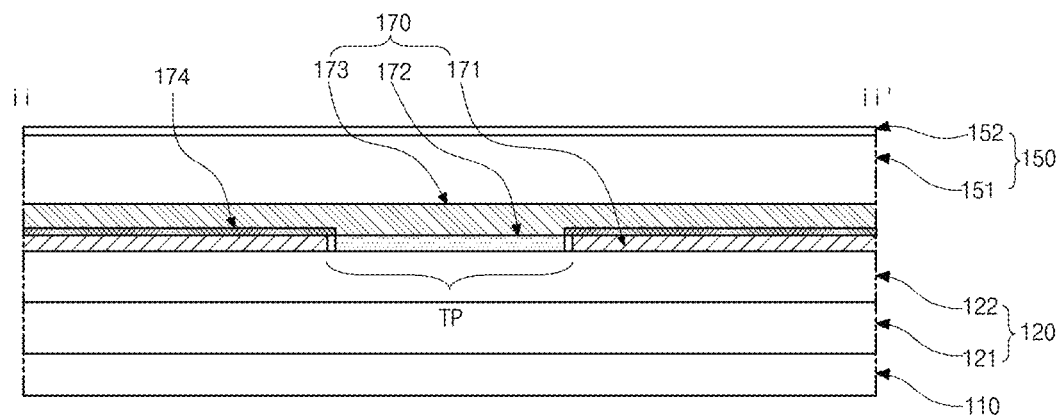
FIG. 4A is a cross-sectional view taken along line ii-ii' of FIG. 1.

FIG. 4A is a cross-sectional view taken along line ii-ii' of FIG. 1.

In FIG. 4A, the test element group TEG includes at least one dummy pattern 170. The at least one dummy pattern 170 includes a first electrode 171, a dummy layer 172, and a second electrode 173. The first electrode 171 is substantially the same as the pixel electrode 161 (of FIG. 2) of the light emitting diode 160 (of FIG. 2), and the second electrode 173 is substantially the same as the common electrode 163 (of FIG. 2) of the light emitting diode 160. The dummy layer 172 may be substantially the same as the light emitting layer 162 (of FIG. 2) of the light emitting diode 160. For example, the dummy layer 172 may include one of the first, second and third emitting units 10, 20 and 30 of the light emitting layer 162.

The first and second electrodes 171 and 173 may be connected to a circuit unit for applying a current to the dummy pattern 170. The first and second electrodes 171 and 173 may be connected to an inspection pad connected to an auto probe in a subsequent inspection process such that a current is applied to the first and second electrodes 171 and 173.

An insulating layer 174 may be disposed between the first and second electrodes 171 and 173 and may have an opening in a verification portion TP. The opening of the insulating layer 174 may be made using a same or similar mask as used for providing the dummy layer 172. When the dummy layer is properly aligned, the dummy layer 172 is disposed such that an electrical connection to the first electrode 171 is minimized, reduced, or does not exist. Thus, the dummy layer 172 in a properly aligned case does not emit light even when a hole and an electron are applied to the first and second electrodes 171 and 173. For example, when the first electrode 171, the dummy layer 172 and the second electrode 173 may be normally formed without an error, the dummy layer 172 does not emit a light.

The abnormal light emitting layer or an abnormal layer of the light emitting layer will be illustrated hereinafter.

Figure 4B:
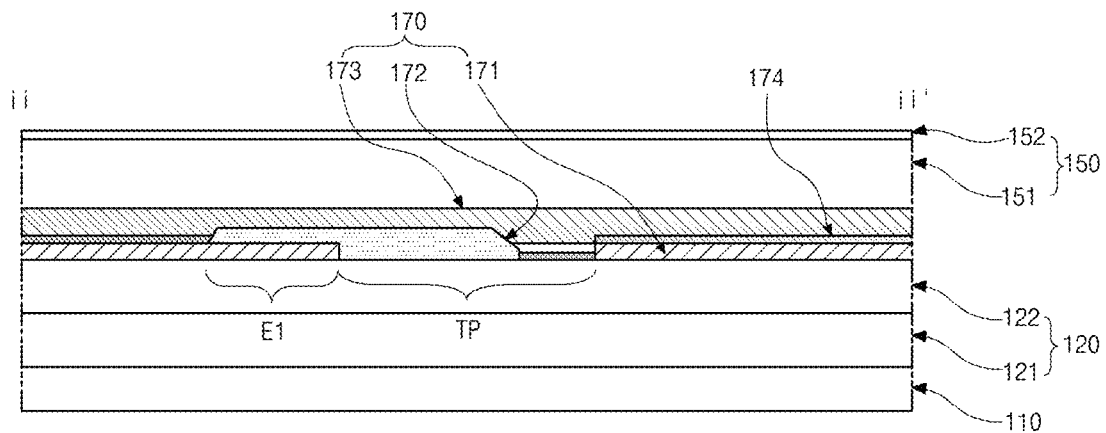
FIG. 4B is a cross-sectional view showing a disposition error of a light emitting layer of an organic light emitting diode display device according to a first embodiment of the present disclosure.

FIG. 4B is a cross-sectional view showing a disposition error of a light emitting layer of an organic light emitting diode display device according to a first embodiment of the present disclosure.

The dummy pattern 170 may be disposed simultaneously with the light emitting diode 160. When the light emitting layer 162 of the light emitting diode 160 is disposed in an undesired place or a disposition amount is changed, the disposition place and the disposition amount of the dummy layer 172 of the dummy pattern 170 may have the same error.

In FIG. 4B, although the dummy layer 172 of the dummy pattern 170 is designed to be disposed in the verification portion TP, an error such that the dummy layer 172 is disposed between the first and second electrodes 171 and 173 in a first error portion E1 may occur due to warpage of a mask for the light emitting layer 162 or misalignment of an inkjet printing apparatus for the light emitting layer 162. The error in the first error portion E1 may cause a color blurring of the light emitting diode. For example, when a current is applied to the dummy pattern 170, the dummy layer 172 in the first error portion E1 may emit light. As a result, in the OLED display device including the dummy pattern 170, the error in the step of disposing the light emitting diode 160 may be easily detected through the emission or increase of the emission luminance of the dummy pattern 170.

Figure 5A:
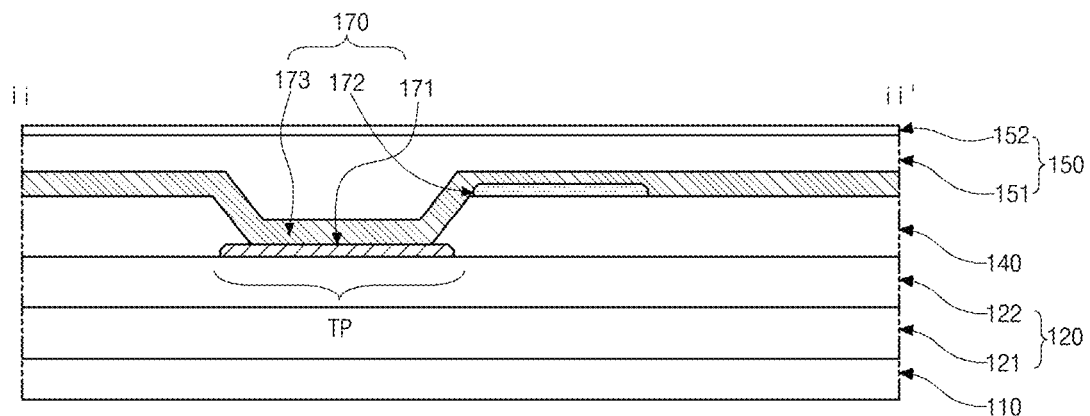
FIGS. 5A and 5B are cross-sectional views showing various dummy patterns of an organic light emitting diode display device according to second and third embodiments, respectively, of the present disclosure.
Figure 5B:
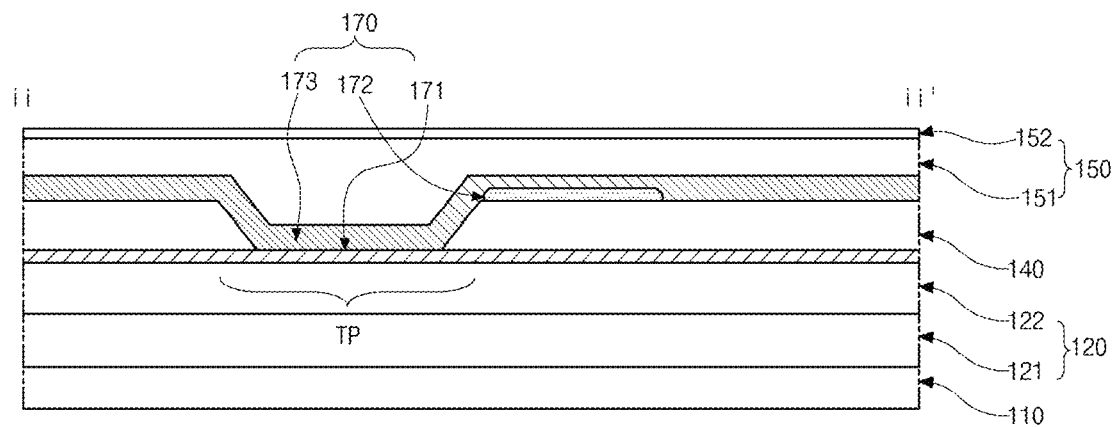

FIGS. 5A and 5B are cross-sectional views showing various dummy patterns of an organic light emitting diode display device according to second and third embodiments, respectively, of the present disclosure.

In FIGS. 5A and 5B, first and second electrodes 171 and 173 are electrically insulated from each other by a bank layer 140 and are electrically connected to each other in a verification portion TP. The first electrode 171 of FIG. 5A is disposed in the verification portion TP, and the first electrode 171 of FIG. 5B is disposed to correspond to the second electrode 173. The first electrode 171 may extend to be connected to an inspection pad portion and may be electrically connected to an inspection circuit through the inspection pad portion.

The opening of the bank layer 140 exposing the first electrode 171 may have the same size and the same shape as the opening of the bank layer 140 exposing the pixel electrode 161 (of FIG. 2), and the dummy layer 172 may be disposed on the bank layer 140 not to overlap the verification portion TP. Here, an insulating layer 174 may be disposed between the bank layer 140 and second electrode 173 and may have an opening in a verification portion TP. The opening of the insulating layer 174 may be made using a same or similar mask as used for providing the dummy layer 172. Thus, the dummy layer 172 is formed in the opening of the insulating layer 174. As such, the dummy layer 172 and the first electrode 171 in a properly aligned arrangement are separated from each other in a plan view not to overlap each other in a plan view.

The dummy layer 172 may be disposed in a step of disposing the light emitting layer 162 (of FIG. 2). When an error in the disposition place or the disposition amount occurs in the step of disposing the light emitting layer 162, the dummy layer 172 may have the same error and the error may be detected from emission in the verification portion TP.

Figure 5C:
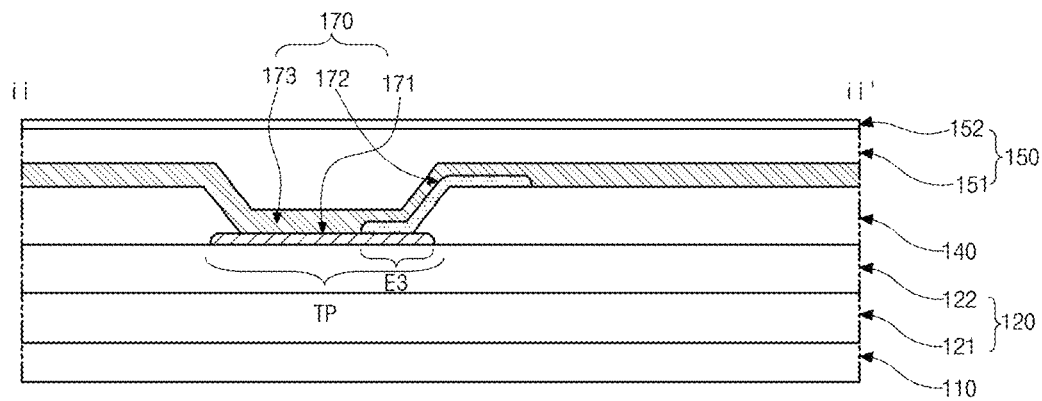
FIG. 5C is a cross-sectional view showing a disposition error of a light emitting layer of an organic light emitting diode display device according to a second embodiment of the present disclosure.

FIG. 5C is a cross-sectional view showing a disposition error of a light emitting layer of an organic light emitting diode display device according to a second embodiment of the present disclosure.

In FIG. 5C, although the dummy layer 172 of the dummy pattern 170 is designed not to overlap the verification portion TP and not to be electrically connected to the first electrode 171, an error such that the dummy layer 172 is disposed to overlap the first electrode 171 in a third error portion E3 may occur due to the disposition error of the light emitting layer 162. As a result, the first and second electrodes 171 and 173 may be electrically connected to each other through the dummy layer 172 of the dummy pattern 170 in the third error portion E3.

When the hole and the electron are injected into the dummy layer 172 of the dummy pattern 170 in the third error portion E3 through the first and second electrodes 171 and 173, respectively, the hole and the electron are recombined in an emitting material layer of the dummy layer 172 similar to the light emitting layer 162, and the dummy layer 172 in the third error portion E3 emits light. As a result, in the OLED display device including the dummy pattern 170, the disposition error in the step of disposing the light emitting diode 160 may be easily detected through the emission or increase of the emission luminance of the dummy pattern 170.

Figure 6A:
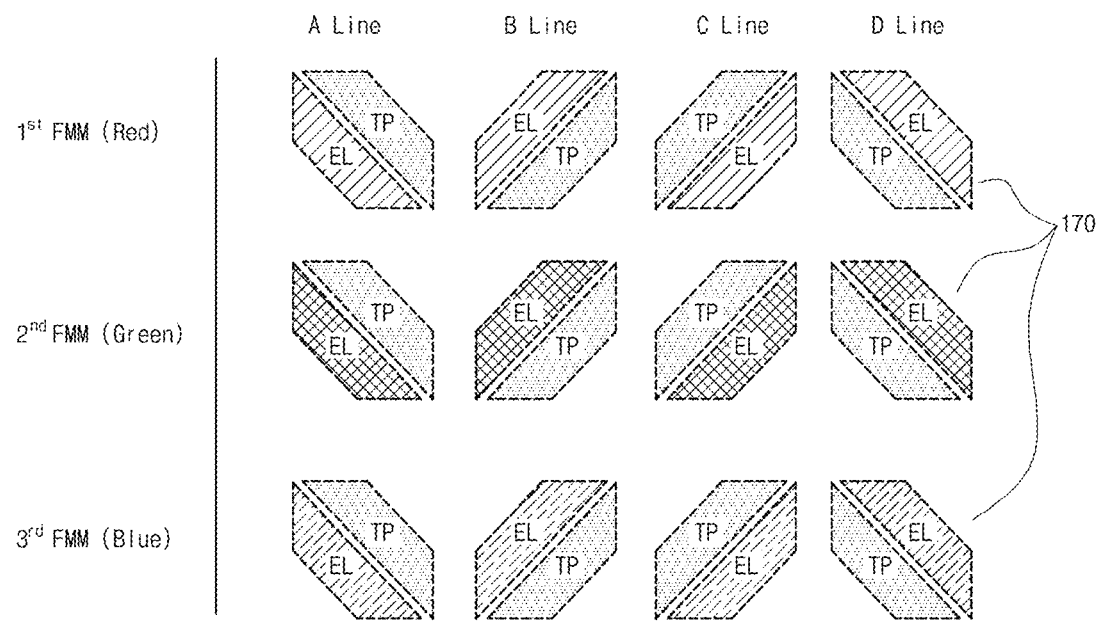
FIGS. 6A and 6B are plan views showing dummy patterns and an error direction, respectively, of an organic light emitting diode display device according to a first embodiment of the present disclosure.
Figure 6B:
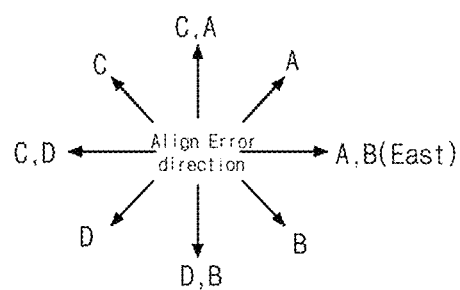

FIGS. 6A and 6B are plan views showing dummy patterns and an error direction, respectively, of an organic light emitting diode display device according to a first embodiment of the present disclosure.

In FIG. 6A, a plurality of dummy patterns 170 are disposed along rows corresponding to first, second and third fine metal masks (FMMs) and columns corresponding to A, B, C, and D lines. The first, second and third FMMs may correspond to red, green and blue, respectively. The plurality of dummy patterns 170 are used for measuring alignment of a mask, alignment in an inkjet printing method or accuracy of an amount of an organic material. Each of the plurality of dummy patterns 170 includes a light emitting layer emitting red, green, and blue colored lights and includes a light emitting diode having the light emitting layer.

Each of the plurality dummy patterns 170 includes a verification portion TP and an emitting portion EL of the light emitting layer. Each of the verification portion TP and the emitting portion EL may have a trapezoidal shape. A border portion between the verification portion TP and the emitting portion EL is disposed along a first diagonal direction (from top left to lower right) in the A and D lines, and is disposed along a second diagonal direction (from lower left to top right) in B and C lines. For example, the verification portion TP and the emitting portion EL of the A line may be disposed at a top right portion and a lower left portion, respectively, and the verification portion TP, and the emitting portion EL of the B line may be disposed at a lower right portion and a top left portion, respectively. The verification portion TP and the emitting portion EL of the A line may be disposed at a top left portion and a right down portion, respectively, and the verification portion TP and the emitting portion EL of the B line may be disposed at a lower left portion and a top right portion, respectively.

An error direction (misalignment direction) may be determined by measuring emission in the verification portion TP of the plurality of dummy patterns 170. A shift direction of the fine metal mask or a distortion direction of the inkjet apparatus may be determined by detecting the emission in the verification portion TP of the dummy pattern 170 of the A, B, C, and D lines.

For example, when the verification portion TP of the dummy pattern 170 of the A and B lines emits light, the error direction may be determined as an East direction, and an alignment may be adjusted forward in a West direction during a step of disposing the light emitting layer 162 (of FIG. 2). Similarly, when the verification portion TP of the dummy pattern 170 of the D and B lines emits light, the error direction may be determined as an South direction, and an alignment may be adjusted forward in a North direction during a step of disposing the light emitting layer 162. When the verification portion TP of the dummy pattern 170 of the C and D lines emits light, the error direction may be determined as a West direction, and an alignment may be adjusted forward in an East direction during a step of disposing the light emitting layer 162. When the verification portion TP of the dummy pattern 170 of the C and A lines emits light, the error direction may be determined as a North direction, and an alignment may be adjusted forward in a South direction during a step of disposing the light emitting layer 162.

Figure 7:
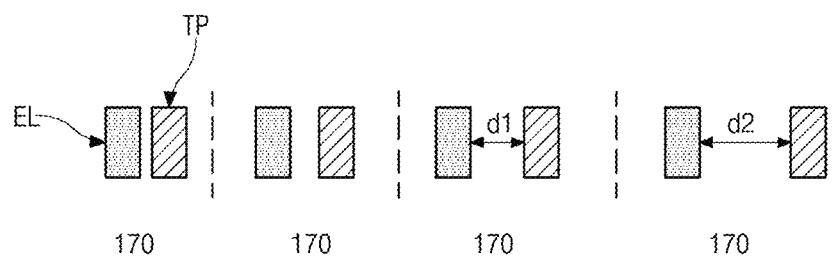
FIG. 7 is a plan view showing various dummy patterns of an organic light emitting diode display device according to first and second embodiments of the present disclosure.

FIG. 7 is a plan view showing various dummy patterns of an organic light emitting diode display device according to first and second embodiments of the present disclosure. While the error direction is detected using the plurality of dummy patterns 170 (of FIG. 6A), accuracies of an amount and a place of an organic material in the light emitting layer may be measured using the dummy patterns 170 of FIG. 7.

In FIG. 7, a plurality of dummy patterns 170 may have a cross-sectional structure of FIG. 5A. The plurality of dummy patterns 170 may have different distances, such as first and second distances d1 and d2 between an emitting portion EL and a verification portion TP. When the light emitting layer 162 (of FIG. 2) is disposed with an error in a place of the organic material, the number of the plurality of dummy patterns 170 where the verification portion TP emits light due to the error may be determined according to a disposition place of the dummy layer 172, and a compensated place may be obtained from the number of the plurality of dummy patterns 170.

Although the error and an error degree are detected from the plurality of dummy patterns 170 in FIGS. 6A, 6B, and 7, the error and the error degree may be detected from a digitized luminance change of a single dummy pattern in another embodiment.

Figure 8:
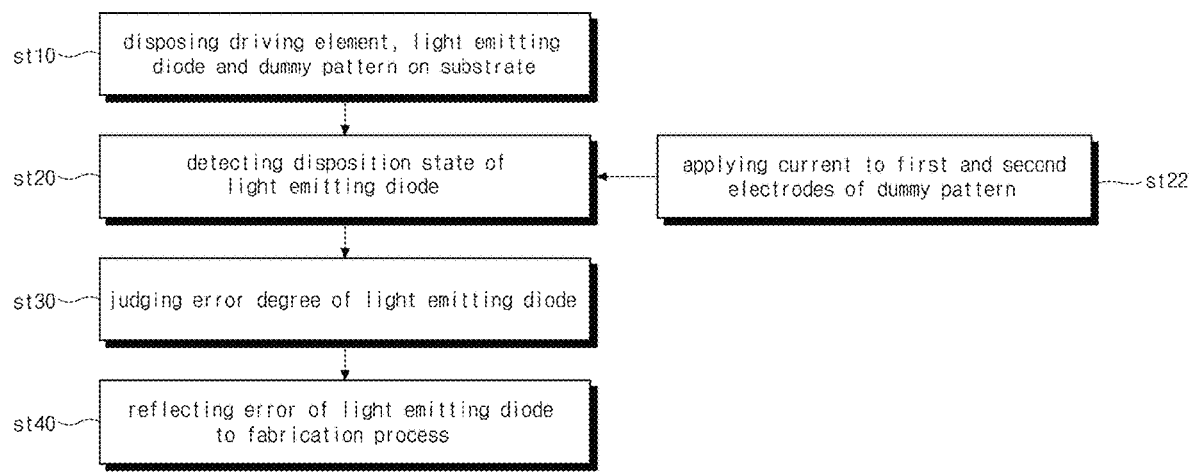
FIG. 8 is a flow chart showing a method of fabricating an organic light emitting diode display device according to a first embodiment of the present disclosure.

FIG. 8 is a flow chart showing a method of fabricating an organic light emitting diode display device according to a first embodiment of the present disclosure.

In FIG. 8, a method of fabricating an organic light emitting diode display device includes a step st10 of disposing a driving element, light emitting diode 160 (of FIG. 2) and a dummy pattern 170 (of FIG. 4A) on a substrate 110 (of FIG. 2), a step st20 of detecting a disposition state of the light emitting diode 160, a step st30 of judging an error degree of the light emitting diode 160 and a step st40 of reflecting an error of the light emitting diode 160 to a fabrication process. The step st20 includes a step st22 of applying a current to first and second electrodes 171 and 173 (of FIG. 4A) of the dummy pattern 170.

In the step st10, after the driving element is disposed on the substrate 110, a planarizing layer 120 (of FIG. 2) is disposed on the driving element. The light emitting diode 160 and the dummy pattern 170 are simultaneously disposed on the planarizing layer 120. For example, a pixel electrode 161 (of FIG. 2), light emitting layer 162 (of FIG. 2) and a common electrode 163 (of FIG. 2) may be sequentially disposed on the planarizing layer 120. At the same time, the first electrode 171, a dummy layer 172 (of FIG. 4A) and the second electrode 173 may be sequentially disposed on the planarizing layer 120.

The dummy layer 172 may be the same as the light emitting layer 162. When the light emitting layer 162 includes a plurality of layers, the dummy layer 172 may be the same as at least one emitting layer of the plurality of layers of the light emitting layer 162. The first and second electrodes 171 and 173 of the dummy pattern 170 may extend to be connected to an inspection pad, and the current may be applied to the first and second electrodes 171 and 173 through the inspection pad.

In the step st20, the disposition state of the light emitting diode 160 is detected. In the step st22, the current is applied to the first and second electrodes 171 and 173 of the dummy pattern 170, and an emission of the dummy pattern 170 is inspected to detect the disposition state of the light emitting diode 160. For example, the dummy pattern may include a plurality of dummy patterns, and the disposition state of the light emitting diode 160 may be detected by measuring the emission of the plurality of dummy patterns, the number of emitting dummy patterns and the luminance change of the emitting dummy pattern.

In the step st30, an error degree of the light emitting diode 160 is judged. For example, the error degree of the light emitting diode 160, the misalignment of the light emitting layer 162 or the state of the mask, such as the fine metal mask, may be judged by analyzing the emitting dummy patterns. When the detected value is over a predetermined reference value, the light emitting diode 160 may be judged as deterioration.

In the step st40, the error of the light emitting diode 160 is reflected to the fabrication process. The compensation value calculated from the error in the disposition place or the disposition amount may be reflected to the fabrication process, and reliability of the OLED display device fabricated through a subsequent process may be improved.

When the current is applied, the dummy pattern 170 emitting light corresponds to deterioration. The light emitted from the dummy pattern 170 may be measured by an optical sensor, and a degree of deterioration, such as the error degree, and a compensation value, such as a compensated direction or a compensated amount, may be digitized according to a luminance degree and a luminance area. The compensation value may be reflected to the step of disposing the light emitting layer 162 in real time. As a result, distortion of the mask is monitored or detected in real time without stop of the fabrication process or the production line, and a stability of a repeated process is obtained by reducing increase of the error.

The dummy pattern may be applied in various ways. Although the error was detected by manually inspecting or measuring the color coordinate change due to color blurring between pixels in the related art, the error or the error degree is automatically detected and the compensated value is immediately reflected to the process using the dummy pattern in the present disclosure. As a result, the productivity increases and the high resolution OLED display device having a fine pattern is obtained.

The dummy pattern may be applied to various layers of the light emitting layer. In addition, the dummy pattern may be removed from the OLED display device through the subsequent scribing process.

In a step of detecting an error according to the present disclosure, the dummy pattern may have a reverse type such that the dummy pattern emits light in a normal state without an error. When there is no error, the dummy pattern electrically connected to the first and second electrodes may emit light. When there is an error, the dummy pattern may not emit light or may emit a relatively low amount of light. Although an error is detected by measuring the luminance of the dummy pattern in the first and second embodiments, an error may be detected by measuring a resistance between the first and second electrodes in another embodiment.

Consequently, in an OLED display device according to the present disclosure, a fabrication reliability increases and a fabrication cost is reduced due to a dummy pattern verifying a disposition state of a light emitting layer. In addition, a fabrication reliability of a high resolution OLED increases due to a plurality of dummy patterns judging a disposition state and an error range of a light emitting layer.

It will be apparent to those skilled in the art that various modifications and variations can be made in the organic light emitting diode display device and the method of fabricating the organic light emitting diode display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. An organic light emitting diode display device, comprising:
   a substrate;
   a plurality of driving elements and a plurality of light emitting diodes on the substrate; and
   at least one dummy pattern on the substrate and including a first electrode, a dummy layer, and a second electrode,
   wherein the dummy layer includes an organic light emitting material,
   wherein the first electrode and the dummy layer are separated from each other in a plan view in an arrangement without an alignment error, and
   wherein the first electrode includes a first opening, and the dummy layer is disposed in the first opening.

2. The device of claim 1, wherein the substrate includes a display region having the plurality of driving elements and the plurality of light emitting diodes, and a non-display region surrounding the display region and having the dummy pattern.

3. The device of claim 1, further comprising an inspection pad connected to the first electrode and the second electrode.

4. The device of claim 1, wherein the light emitting diode includes an organic light emitting material.

5. The device of claim 1, wherein the substrate has a plurality of pixels defined therein such that at least one driving element among the plurality of driving elements and at least one light emitting diode among the plurality of light emitting diodes are disposed in each pixel.

6. The device of claim 1, wherein the at least one dummy pattern includes a plurality of verification portions and a plurality of emitting portions, and
   wherein a border portion between each of the plurality of verification portions and each of the plurality of emitting portions is disposed along a diagonal direction, or the plurality of verification portions and the plurality of emitting portions are spaced apart from each other by difference distances.

7. An organic light emitting diode display device, comprising:
   a substrate;
   a plurality of driving elements and a plurality of light emitting diodes on the substrate; and
   at least one dummy pattern on the substrate and including a first electrode, a dummy layer, and a second electrode,
   wherein the dummy layer includes an organic light emitting material,
   wherein the first electrode and the dummy layer are separated from each other in a plan view in an arrangement without an alignment error, and
   wherein the dummy pattern further includes an insulating layer between the first electrode and the second electrode.

8. The device of claim 7, wherein the insulating layer has a second opening, and the dummy layer is in the second opening.

9. The device of claim 8, wherein the first electrode defines a first opening therein and the dummy layer is in the first opening.

10. An organic light emitting diode display device, comprising:
    a substrate;
    a plurality of driving elements and a plurality of light emitting diodes on the substrate; and
    at least one dummy pattern on the substrate and including a first electrode, a dummy layer, and a second electrode,
    wherein the dummy layer includes an organic light emitting material,
    wherein the first electrode and the dummy layer are separated from each other in a plan view in an arrangement without an alignment error, and
    wherein when a current is applied to the at least one dummy pattern, the at least one dummy pattern in an arrangement without an alignment error does not emit light and the at least one dummy pattern in an arrangement with an alignment error emits light.

* * * * *